United States Patent
Fukaya et al.

(10) Patent No.: US 7,646,089 B2
(45) Date of Patent: Jan. 12, 2010

(54) SEMICONDUCTOR PACKAGE, METHOD FOR MANUFACTURING A SEMICONDUCTOR PACKAGE, AN ELECTRONIC DEVICE, METHOD FOR MANUFACTURING AN ELECTRONIC DEVICE

(75) Inventors: Futoshi Fukaya, Kawasaki (JP); Yuichi Asano, Kawasaki (JP); Yoshinori Niwa, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/121,508

(22) Filed: May 15, 2008

(65) Prior Publication Data
US 2009/0283897 A1    Nov. 19, 2009

(51) Int. Cl.
*H01L 23/22*    (2006.01)
*H01L 23/24*    (2006.01)
*H01L 23/14*    (2006.01)
*H01L 23/29*    (2006.01)

(52) U.S. Cl. .................. 257/687; 257/702; 257/789; 257/E23.136

(58) Field of Classification Search .......... 257/687, 257/702, 789, E23.136
See application file for complete search history.

(56) References Cited

U.S. PATENT DOCUMENTS 5,314,842 A    5/1994    Sawaya et al.
7,064,452 B2 *    6/2006    Huang et al. ............ 257/787
2008/0258278 A1 *    10/2008    Ramos et al. ............ 257/676
2008/0265386 A1 *    10/2008    Muto et al. .............. 257/676
2009/0023249 A1 *    1/2009    Honer et al. ............. 438/113

FOREIGN PATENT DOCUMENTS

| JP | S54-060564 A | 5/1979 |
|---|---|---|
| JP | 01-220463 A | 9/1989 |
| JP | 02-94653 A | 4/1990 |
| JP | 11-054687 A | 2/1999 |
| JP | 11-54687 A | 2/1999 |

\* cited by examiner

*Primary Examiner*—Ngan Ngo
(74) *Attorney, Agent, or Firm*—Westerman, Hattori, Daniels & Adrian, LLP

(57) ABSTRACT

A semiconductor package including a substrate with a semiconductor device mounted on the substrate and a resin member sealing the substrate and semiconductor device. The resin member includes a first surface and a second surface located on the other side of the first surface and a plurality of leads electrically connected with the semiconductor device. The leads project from the resin member and extend to the second surface side; wherein the second surface of the resin member includes a first area having a first concave portion and a second area having a second concave portion which is different from the first area, and the second concave portion is deeper than the first concave portion.

10 Claims, 17 Drawing Sheets

SEMICONDUCTOR PACKAGE, METHOD FOR MANUFACTURING A SEMICONDUCTOR PACKAGE, AN ELECTRONIC DEVICE, METHOD FOR MANUFACTURING AN ELECTRONIC DEVICE

TECHNICAL FILED

The present invention relates to a surface-mounted semiconductor package including plural leads as external terminals, a method for manufacturing the semiconductor package, an electronic device including the semiconductor package, and a method for manufacturing the electronic device.

BACKGROUND

Japanese Laid-open Patent Application No. Hei 11-54687 discloses the mounting technology of a surface-mounted semiconductor package by flow soldering. In this mounting technology, first of all, a semiconductor package is tentatively fixed on the main surface of a circuit board with an adhesive. Next, the circuit board is flipped upside down to locate the semiconductor package so as to be facing downward on the circuit board. Then, the semiconductor package and the circuit board are exposed to melted solder so that the external lead of the semiconductor package is soldered with the electrodes of the circuit board. However, in Japanese Laid-open Patent Application No. Hei 11-54687, the semiconductor package may drop when the circuit board is upside down as mentioned above.

SUMMARY

According to an aspect of an embodiment, a semiconductor package includes a substrate; a semiconductor device mounted on the substrate; a resin member sealing the substrate and semiconductor device, the resin member including a first surface and a second surface located on the other side of the first surface; and a plurality of leads electrically connected with the semiconductor device, the leads projecting from the resin member and extending to the second surface side; wherein the second surface of the resin member includes a first area having a first concave portion and a second area having a second concave portion, the second area is different from the first area, and the second concave portion is deeper than the first concave portion.

According to an another aspect of an embodiment, a method for manufacturing a semiconductor package includes steps of mounting a semiconductor device on a substrate; connecting a plurality of leads with the semiconductor device electrically; forming a resin member sealing the substrate, semiconductor device, and a first portion of the leads, the resin member including a first surface and a second surface located on the other side of the first surface and including a first area having a first concave portion; forming a second concave portion deeper than the first concave portion in a second area different from the first area on the second surface of the resin member; and bending a second portion of the leads projecting from the resin member to the second surface side of the resin member.

According to a further aspect of an embodiment, an electronic device includes a mounting board; a semiconductor package including resin member and a plurality of leads projecting from the resin member and electrically connected with the mounting board; and an adhesive bonding the semiconductor package with the mounting board; wherein a surface of the resin member opposite to the mounting board includes a first area having a first concave portion and a second area having a second concave portion and being different from the first area, and the second concave portion is deeper than the first concave portion and is embedded with the adhesive.

According to a further aspect of an embodiment, a method for manufacturing an electronic device includes preparing a semiconductor package including a resin member having a first surface and a second surface located on the other side of the first surface and a plurality of leads projecting from the resin member and extending to the second surface side of the resin material, the second surface of the resin member including a first area having a first concave portion and a second area having a second concave portion deeper than the first concave portion and being different from the first area; preparing a mounting board; fixing the semiconductor package on the mounting board by an adhesive disposed in the second concave portion; and mounting the semiconductor package on the mounting board in a posture in which the semiconductor package is at the lower position of the mounting board.

DETAILED DESCRIPTION OF THE EMBODIMENT

First Embodiment

Configuration of a Semiconductor Package 10

Figure 1:
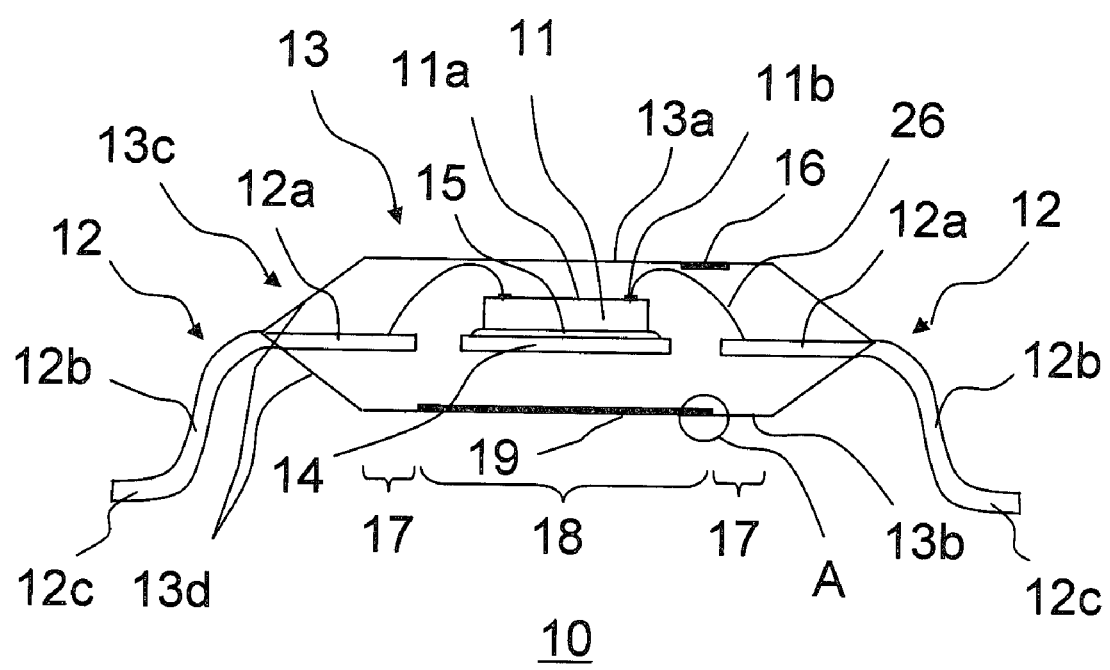
FIG. 1 is a schematic view showing a semiconductor package of one embodiment of the present invention.

In reference to FIGS. 1 to 5, the configuration of the semiconductor package 10 is explained. FIG. 1 is a schematic view showing the semiconductor package 10 of one embodiment of the present invention.

As shown in FIG. 1, the semiconductor package 10 includes a semiconductor device 11, plural leads 12 (only two leads are shown in the figure), and sealing resin 13. A semiconductor device 11 includes devices such as transistor, condensers, and inductors on a semiconductor substrate that is, for example, a silicon substrate. However, it is not limited to the semiconductor device 11 and other electronic device sealed by the sealing resin 13, for example, an image sensor may also be used.

The semiconductor device 11 is bonded on the main surface of a die pad 14 with an adhesive 15 such as an Ag paste. The semiconductor device 11 includes a circuit formation surface 11a on a reverse-side of the die pad 14, that is, on the upper side within the figure. Plural electrode pads 11b (only two electrode pads are shown in the figure) are formed in the fringe part on the circuit formation surface 11a. As for the material of the electrode pad 11b, for example, a conductive material such as Al is used.

Each lead 12 includes an inner lead part (a first portion) 12a disposed inside of the sealing resin 13 and the outer lead part (a second portion) 12b disposed outside of the sealing resin 13. Each inner lead part 12a is electrically connected with the electrode pad 11b formed on the semiconductor device 11 with a bonding wire 26. Each outer lead part 12b is used as the external terminal of the semiconductor package 10 and projects from the side surface 13c of the sealing resin 13.

Each outer lead part 12b is bent to the second main surface 13b side, that is, in the lower side of the figure adjacent to the sealing resin 13. In addition, each outer lead part 12b is bent in the lower side of the second main surface 13b of the sealing resin 13 so as to be apart from the side surface 13c of the sealing resin 13. As a result, each outer lead part 12b extends to the lower side of the second main surface 13b from the side surface 13c of the sealing resin 13, and further extends to the lower side of the second main surface 13b laterally to the side of the sealing resin 13. As for a package including such a lead shape, such as QFP (quad flat package) and SOP (small outline package) are known.

On the surface of the end portion 12c of each outer lead part 12b, plating is applied to improve the wettability of melted solder 34 described later. As a kind of plating, such as Sn—Pb, and Sn—Bi are used. The plural leads 12 and die pads 14 are formed from a common lead frame 24 described later. The material of the lead frame 24 is not especially limited, though conductors such as Fe—Ni alloy, Cu, and Cu alloys maybe used.

The sealing resin 13 seals the semiconductor device 11, die pad 14, plural inner lead part 12a and plural bonding wires 26. A material, such as an epoxy resin, maybe used as the sealing resin 13. Fillers such as $SiO_2$ may be added to the sealing resin 13. The fillers such as $SiO_2$ decrease the coefficient of thermal expansion of the sealing resin 13 and improve the heat radiation of the sealing resin 13. In addition, colorant such as carbon may be added to the sealing resin 13. Further, wax may be added to the sealing resin 13, if necessary, as releasing agent from a mold die 27 described later. Paraffin wax may be used as the wax. However, it is not especially limited thereto. The amount of wax to add is adjusted for the whole of the sealing resin 13 to about 0.5 to 2.0 wt %. In this embodiment, the amount of wax added to the sealing resin 13 is about 1 wt %. The wax added to the sealing resin 13 has the character to diffuse to the surface side of the sealing resin 13. As a result, the more it approaches the surface of the sealing resin 13, the more the concentration of wax rises. Especially, the surface of the sealing resin 13 has very high concentration of wax and it might be a wet state with the wax that permeates from the inside of the sealing resin 13.

The sealing resin 13 includes the first main surface 13a, the second main surface 13b that is parallel to the first main surface 13a, and the side surface 13c that is continuous with the first main surface 13a and second main surface 13b. The first main surface 13a is disposed on the side of the circuit formation surface 11a of the semiconductor device 1, that is, on the upper side of the figure. A concave mark 16 such as a manufacturer name and serial number is formed on the first main surface 13a. A laser beam maybe used as a means for forming the concave mark 16. As for the laser beam source, a laser seal machine that includes a YAG laser, for example, maybe used.

The side surface 13c of the sealing resin 13 includes two inclined surfaces 13d that incline to the first and second main surfaces 13a and 13b. The two inclined surfaces 13d are continuous with each other near the center of the thickness direction of the sealing resin 13. And, above-mentioned plural outer lead parts 12b project from the side surface 13c. However, the shape of the sealing resin 13 is not limited to this. For example, the side surface 13c of the sealing resin 13 may be a nearly perpendicular plane to the first and second main surfaces 13a and 13b. In addition, it is not indispensable that the outer lead part 12b projects from the side surface 13c of the sealing resin 13 either. For example, the outer lead part 12b may project from the first main surface 13a or the second main surface 13b.

Figure 5:
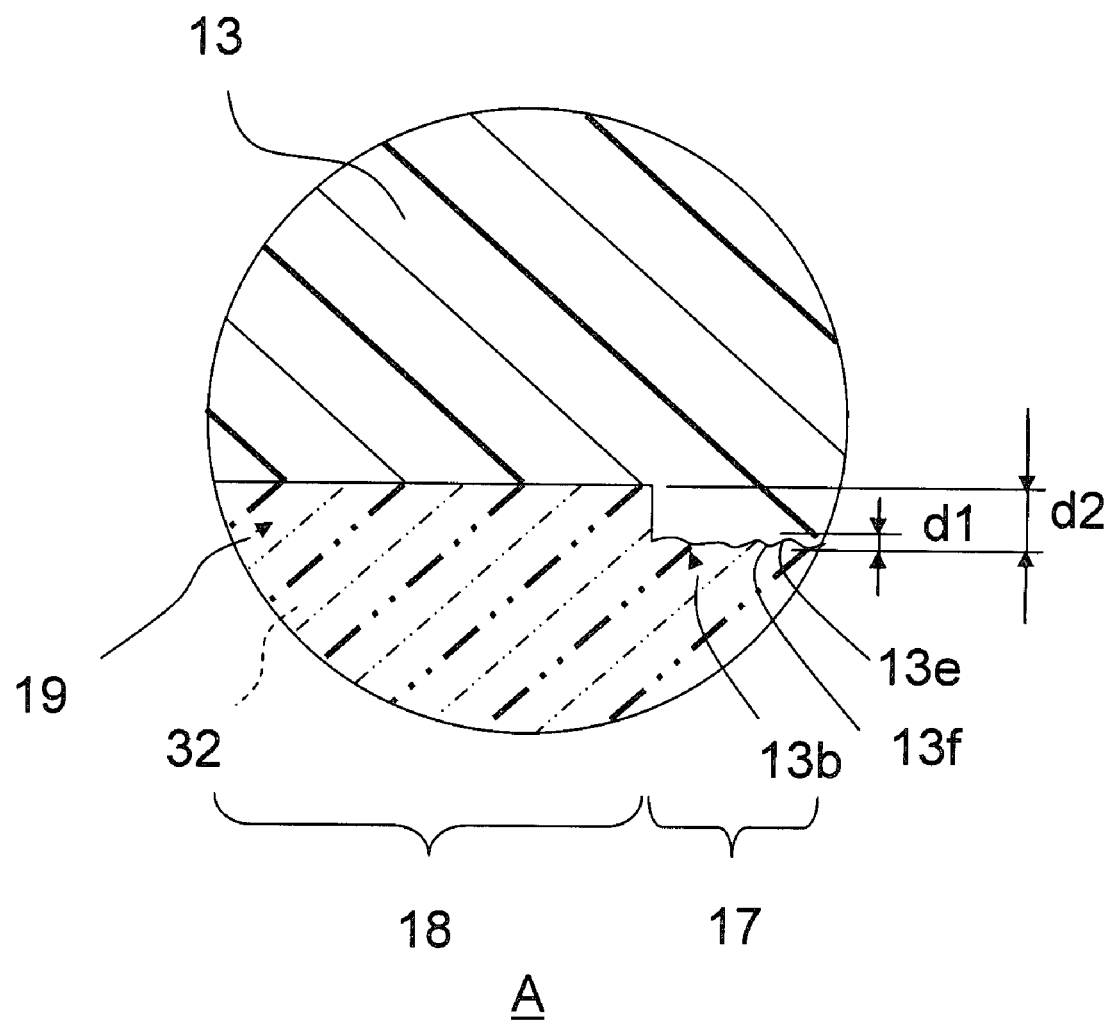
FIG. 5 is a cross-sectional view showing a concave pattern of one embodiment of the present invention.

FIG. 5 shows a cross section within the range shown by a code A in FIG. 1. A solid line section on the upper side of FIG. 5 shows the sealing resin 13, and the alternate long and two short dashes line on the lower side of FIG. 5 shows an adhesive 32 to be supplied. The second main surface 13b includes the first area 17 and the second area 18 as shown in FIG. 1 and FIG. 5. The first area 17 is an annular region disposed to the peripheral part of the second main surface 13b. In the first area 17, as shown in FIG. 5, a concave portion 13e and a convex portion 13f to improve the removability of the sealing resin 13 from the mold die 27 are formed. The second area 18 is a rectangular area disposed inside the first area 17. A concave pattern 19 to improve the adhesion of sealing resin 13 and adhesive 32 described later is formed in the second area 18.

Figure 2:
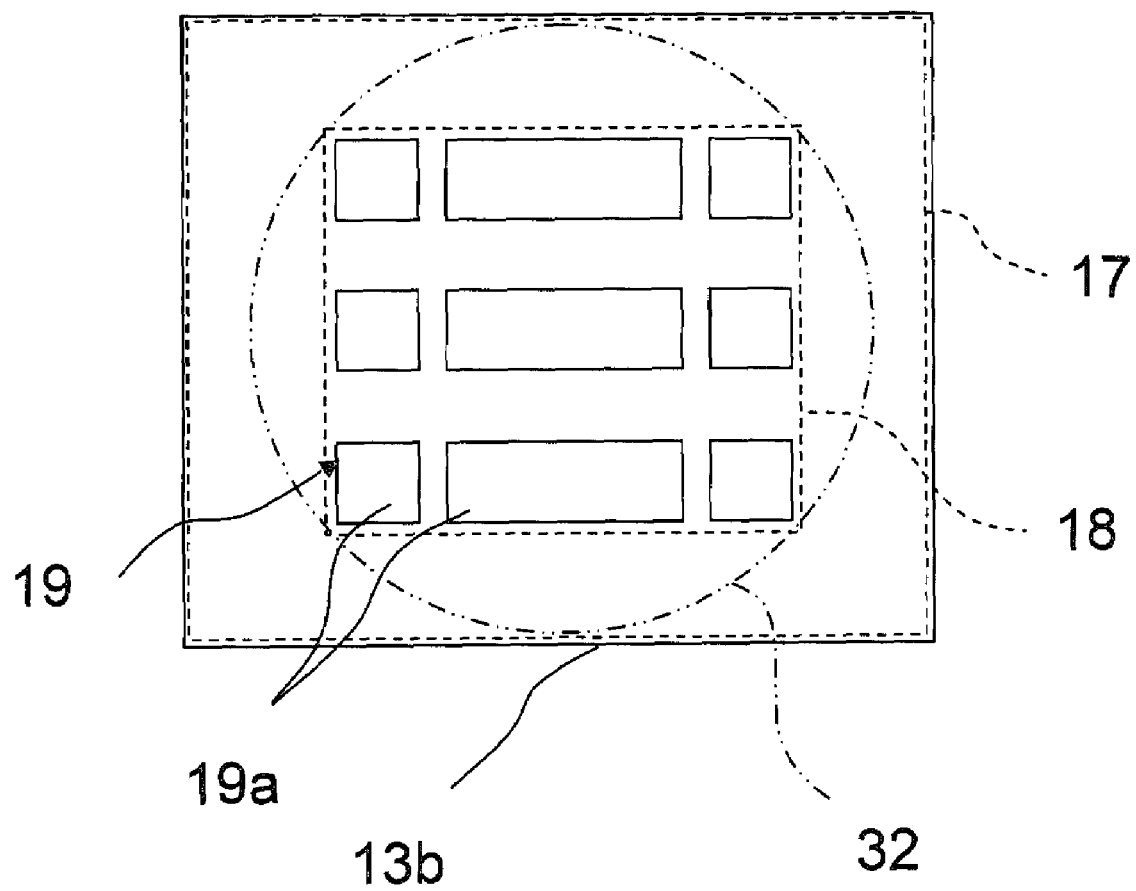
FIG. 2 is a plan view showing a concave pattern of one embodiment of the present invention.
Figure 3:
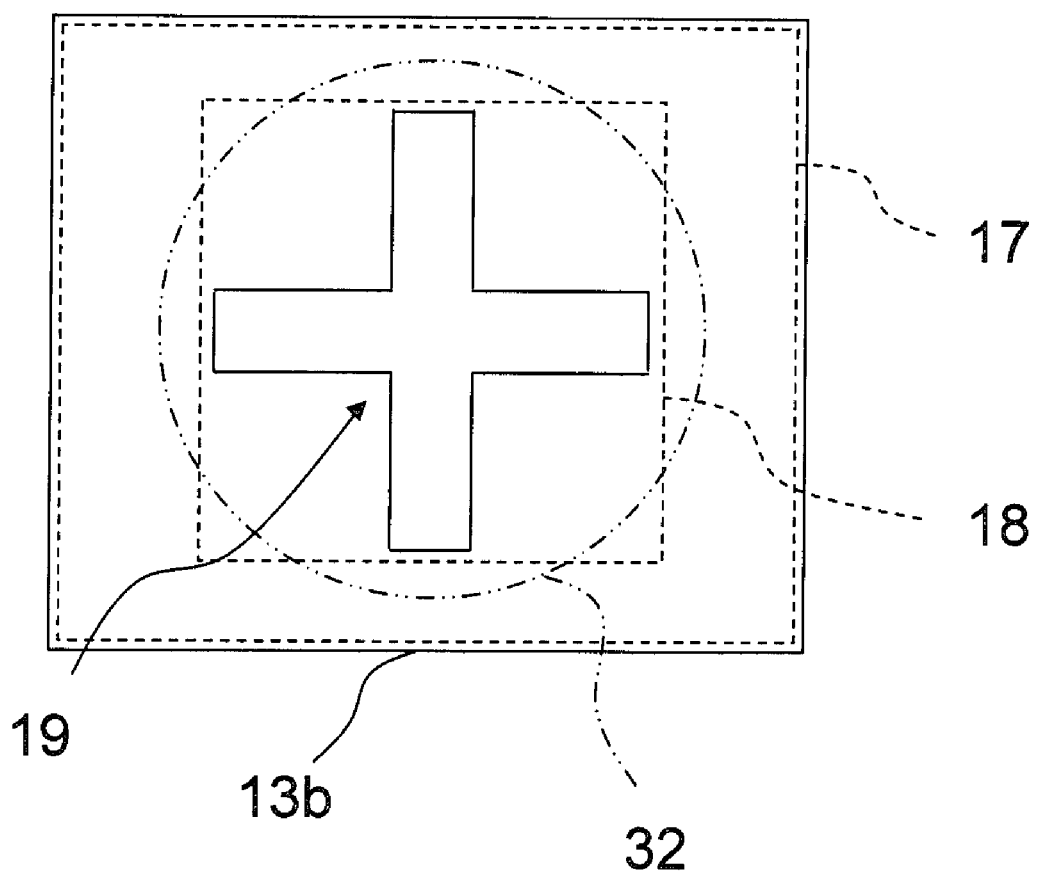
FIG. 3 is a plan view showing a concave pattern as an alternatively formed example of one embodiment of the present invention.
Figure 4:
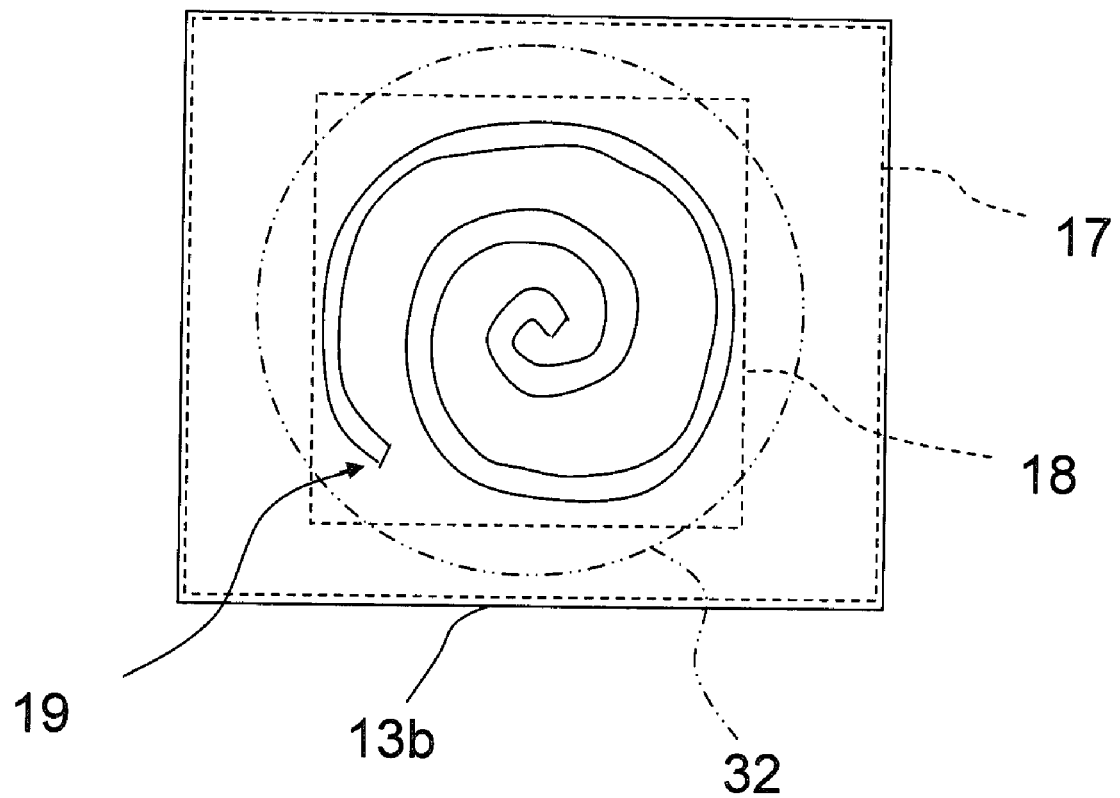
FIG. 4 is a plan view showing a concave pattern as another alternatively formed example of one embodiment of the present invention.

For example, the shapes shown in FIGS. 2 to 4 can be enumerated as the shape of concave pattern 19. FIG. 2 is a plan view of the concave pattern 19 of one embodiment of the present invention. FIG. 3 is a plan view of the concave pattern 19 as an alternatively formed example of one embodiment of the present invention. FIG. 4 is a plan view of the concave pattern 19 as another alternatively formed example of one embodiment of the present invention.

That is, as shown in FIG. 2, the concave pattern 19 may be formed as rectangular concave portions 19a. In addition, the shape of the concave pattern 19 may also be a cross shape as shown in FIG. 3. Further, the shape of the concave pattern 19 may also be a spiral type as shown in FIG. 4. However, the concave pattern 19 formed in the second area 18 as shown in FIG. 5 should be deeper than the concave portion 13e formed in the first area 17. That is, it is necessary that the relation of d1<d2 should be established when the depth of concave portion 13e formed in the first area 17 is assumed to be d1, and the depth of concave pattern 19 is assumed to be d2. Usually, because the depth d1 of the concave portion formed in the first area 17 is set to about 5 to 20 μm, an average of about 12 μm, the depth d2 of the concave pattern 19 formed in the second area 18 is set to about 20 to 50 μm. For example, a laser beam may be used as a means for forming the concave pattern 19. As for the laser beam source, the laser seal machine such as a YAG laser mentioned above may be used.

Manufacturing Process of the Semiconductor Package 10

In reference to FIGS. 6 to 12, the manufacturing process of the above-mentioned semiconductor package 10 is explained. FIGS. 6 to 12 are the process charts of the manufacturing process of the semiconductor package 10 of one embodiment of the present invention. As for a wafer W in FIG. 6, the wafer process is complete. That is, plural semiconductor devices 11 are manufactured in the wafer W.

Figure 6:
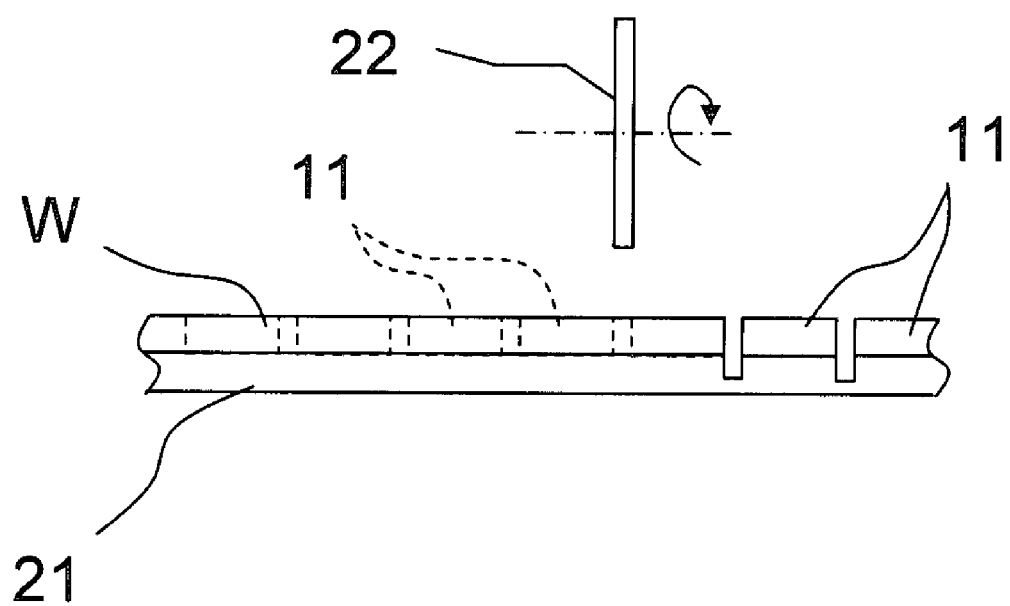
FIG. 6 is a schematic view showing a manufacturing process of a semiconductor package of one embodiment of the present invention.
Figure 7:
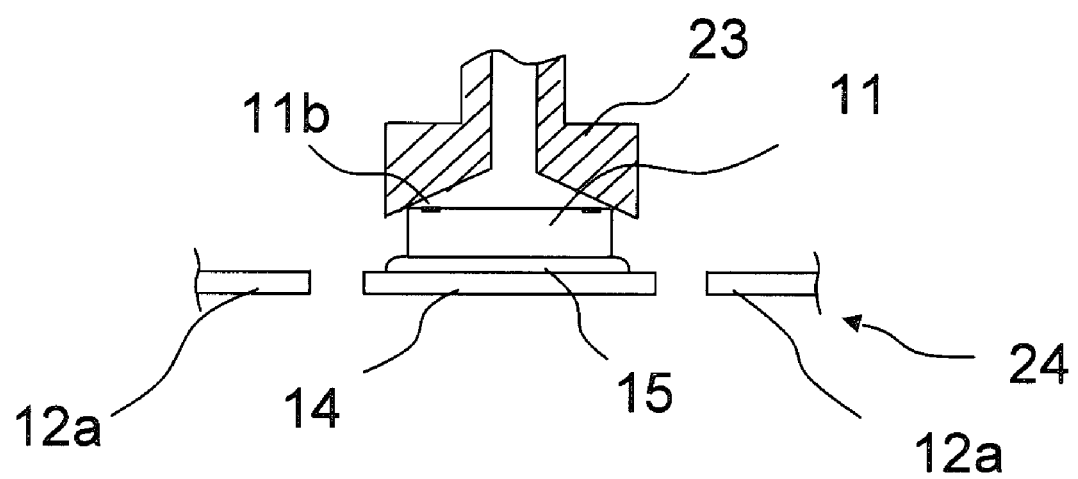
FIG. 7 is a schematic view showing a manufacturing process of a semiconductor package of one embodiment of the present invention.

First, a dicing tape 21 is put on the backside of the wafer W as shown in FIG. 6. Subsequently, the wafer W is singulated with a dicing blade 22 per semiconductor device 11. Next, as shown in FIG. 7, each singulated semiconductor device 11 is sucked by a collet 23, and is bonded on the main surface of each die pad 14 that is connected with the lead frame 24 with the adhesive 15 such as an Ag paste.

Figure 8:
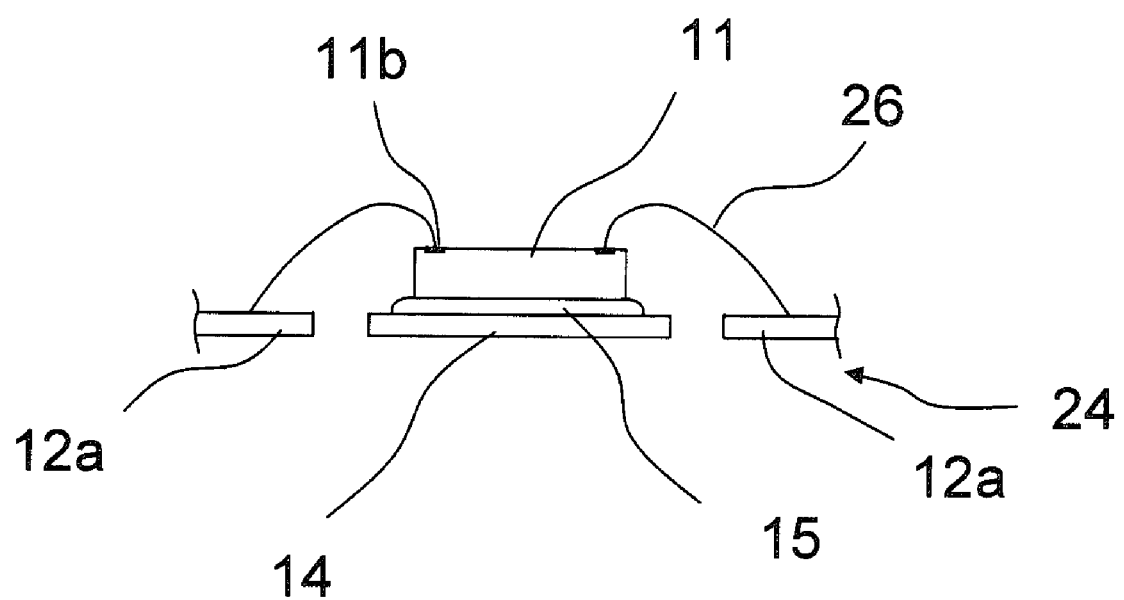
FIG. 8 is a schematic view showing a manufacturing process of a semiconductor package of one embodiment of the present invention.

Next, as shown in FIG. 8, the electrode pad 11b of the semiconductor device 11 is connected with the bonding wire 26 to the inner lead part 12a of each lead 12 that is connected with the lead frame 24. As a result, each electrode pad 11b of the semiconductor device 11 is electrically connected to each lead 12 of the lead frame 24.

Figure 9:
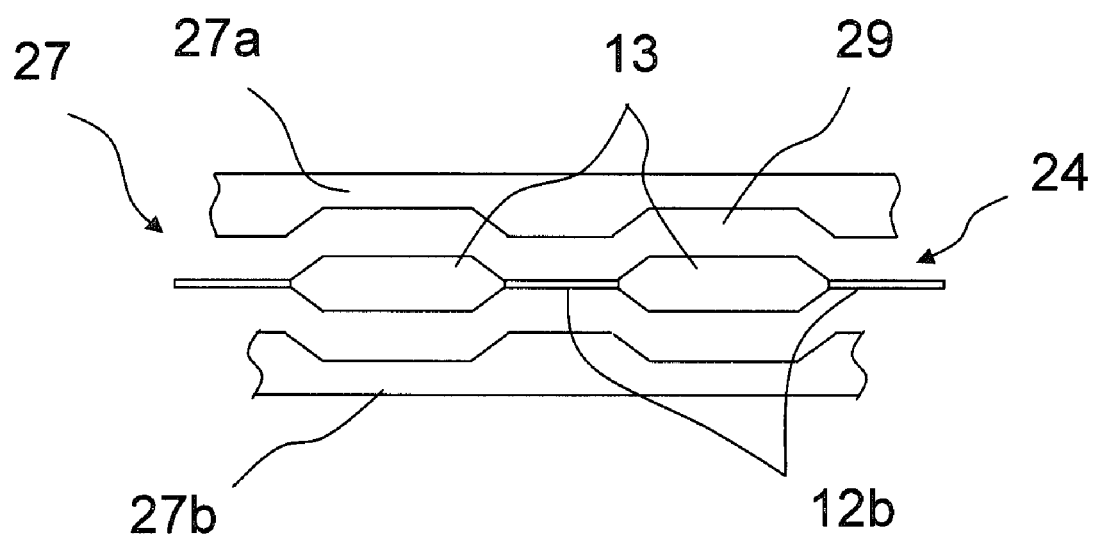
FIG. 9 is a schematic view showing a manufacturing process of a semiconductor package of one embodiment of the present invention.

Next, as shown in FIG. 9, the lead frame 24 is disposed between the upper die 27a and the lower die 27b of the mold die 27, and the uncured resin material that becomes the sealing resin 13 is supplied in a cavity 29 formed between the upper die 27a and the lower die 27b. The uncured resin material is cured by heating it for 1 to 2 minutes under the temperature of 170 to 180° C. As a result, the semiconductor device 11, die pad 14, inner lead part 12a, and bonding wire 26 are sealed within the sealing resin 13. However, the outer lead part 12b is still exposed from the sealing resin 13.

On the inner surface of the mold die 27 with which the sealing resin 13 is contact, for example a concave and convex shape is formed by such as electric discharge machining. As a result, the above-mentioned concave portion 13e and convex portion 13f are formed in the second main surface 13b of the completed sealing resin 13. In addition, because the mold die 27 includes the plural cavities 29 between the upper die 27a and the lower die 27b, as shown in FIG. 9, the plural sealing resins 13 can be formed on the lead frame 24 by molding once. (Only two resin resins 13 are shown in the figure.)

Figure 10:
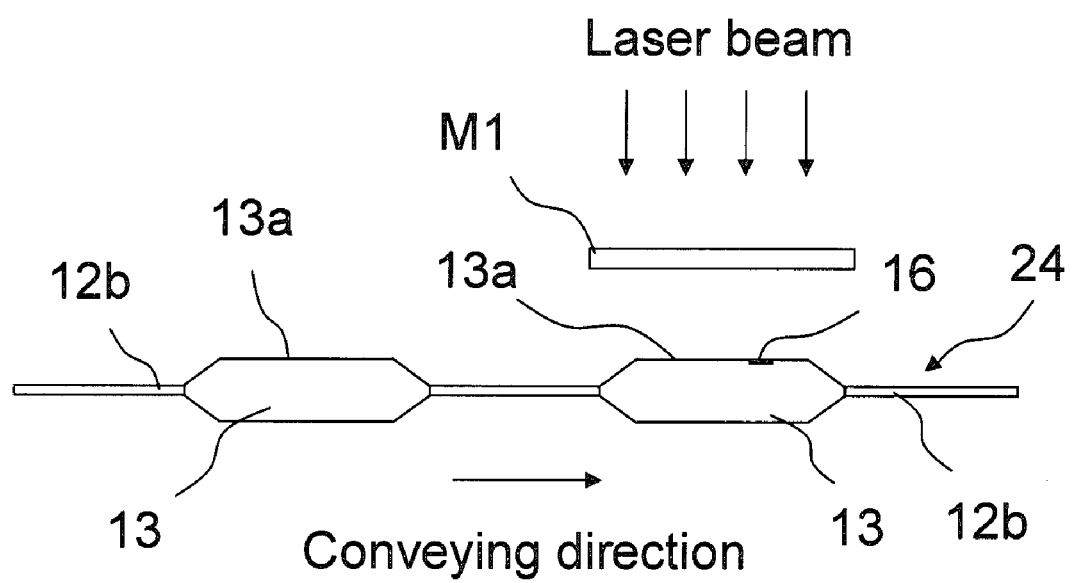
FIG. 10 is a schematic view showing a manufacturing process of a semiconductor package of one embodiment of the present invention.

Next, as shown in FIG. 10, the concave mark 16 that indicates such as a manufacturer name and serial number are formed on the first main surface 13a of the sealing resin 13. Specifically, the lead frame 24 is transported in the direction of the arrow by the conveying device in posture in which the first main surface 13a of sealing resin 13 is turned up. And, when the sealing resin 13 arrives under a mask M1, the laser beam is irradiated to the first main surface 13a of the sealing resin 13 through mask M1 by such as laser seal machine. As the mask M1, for example, a glass substrate on which the shading film such as Cr formed may be used. The film is patterned on such as a manufacturer name and serial number. As a result, if the laser beam that passed the mask M1 is irradiated to the first main surface 13a of the sealing resin 13, the concave mark 16 corresponding to such as the manufacturer name and serial number is transferred in the predetermined position of the first main surface 13a. A laser, such as a YAG laser may be used in the laser seal machine.

Figure 11:
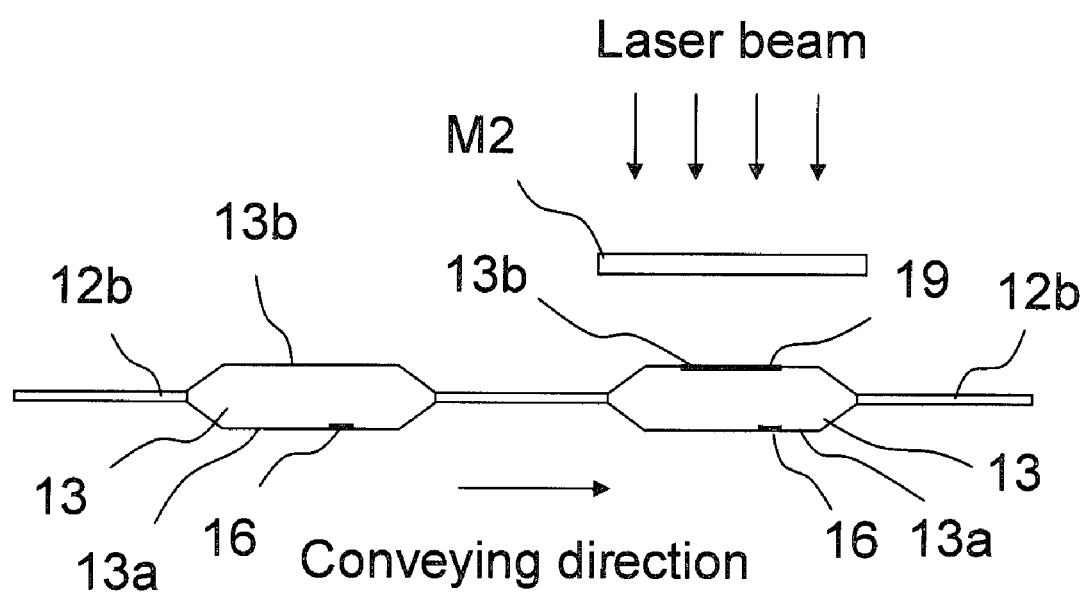
FIG. 11 is a schematic view showing a manufacturing process of a semiconductor package of one embodiment of the present invention.

Next, as shown in FIG. 11, the lead frame 24 is turned upside down by manual operation or by using a reserving unit to turn up the second main surface 13b of the sealing resin 13. And, the lead frame 24 is transported in the direction of the arrow by such as the conveying unit. When the sealing resin 13 arrives under a mask M2, the laser beam is irradiated to the second main surface 13b of the sealing resin 13 through mask M2 by such as the laser seal machine. As the mask M2, for example, a glass substrate on which the shading film such as Cr formed may be used. The film is patterned on the shape corresponding to the concave pattern 19. As a result, if the laser beam that passed the mask M2 is irradiated to the second main surface 13b of the sealing resin 13, the concave pattern 19 is transferred in the predetermined position of the second main surface 13b. A laser, such as the YAG laser may be used in the laser seal machine. When the concave pattern 19 is formed, the laser seal machine used when the above-mentioned concave mark 16 is formed may be used. The depth of the concave pattern 19 can be controlled by the output adjustment of the laser. For example, to make the depth of the concave pattern 19 about 20 to 50 μm, the output of the YAG laser is set to about 500 to 2000 mJ. In addition, in the present embodiment, though the lead frame 24 is upside down and the laser beam is irradiated to the second main surface 13b of the sealing resin 13, the present invention is not limited to this. For example, it is also possible to dispose another laser seal machine under the transported lead frame 24, and irradiate the laser beam from the lower side of the lead frame 24 to the second main surface 13b of the sealing resin 13. In addition, it is also possible to reverse the formation order of the concave mark 16 and concave pattern 19.

Figure 12:
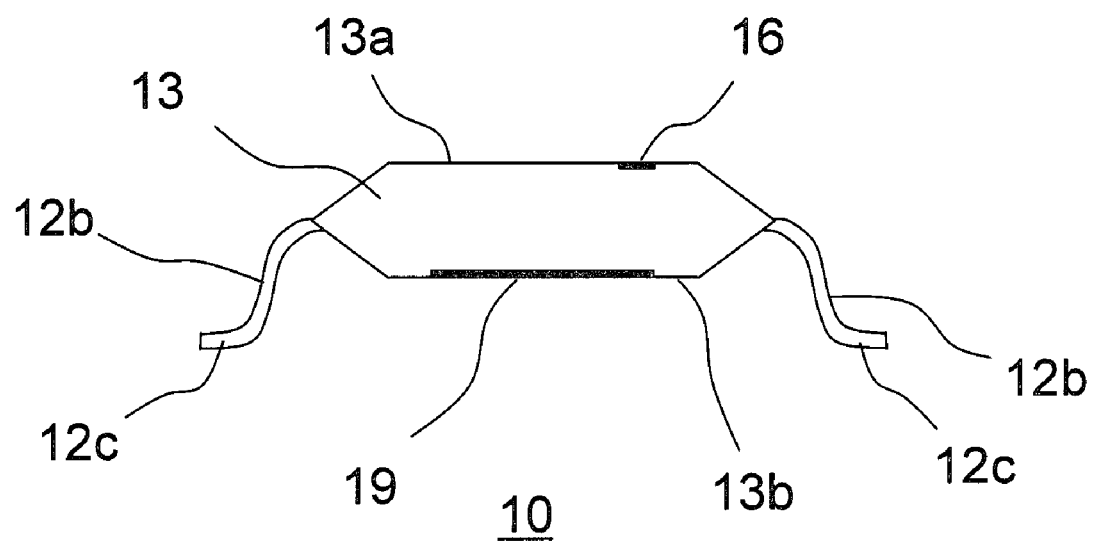
FIG. 12 is a schematic view showing a manufacturing process of a semiconductor package of one embodiment of the present invention.

Next, as shown in FIG. 12, the lead frame 24 is singulated per sealing resin 13, for example by using a cutting device. Then, the outer lead part 12b is bent to the second main surface 13b side of the sealing resin 13 in the vicinity of the sealing resin 13. Further, the outer lead part 12b is bent in the lower side of the second main surface 13b of the sealing resin 13 to the outside of sealing resin 13. As a result, each outer lead part 12b is formed to the L-type lead. Because the end portion 12c of each outer lead part is located in the lower position than the second main surface 13b of the sealing resin 13, when the semiconductor package 10 is mounted on the mounting board 31, a space S described later is formed between the surface of the mounting board 31 and the second main surface 13b of the sealing resin 13.

Configuration of an Electronic Device 30

Figure 13:
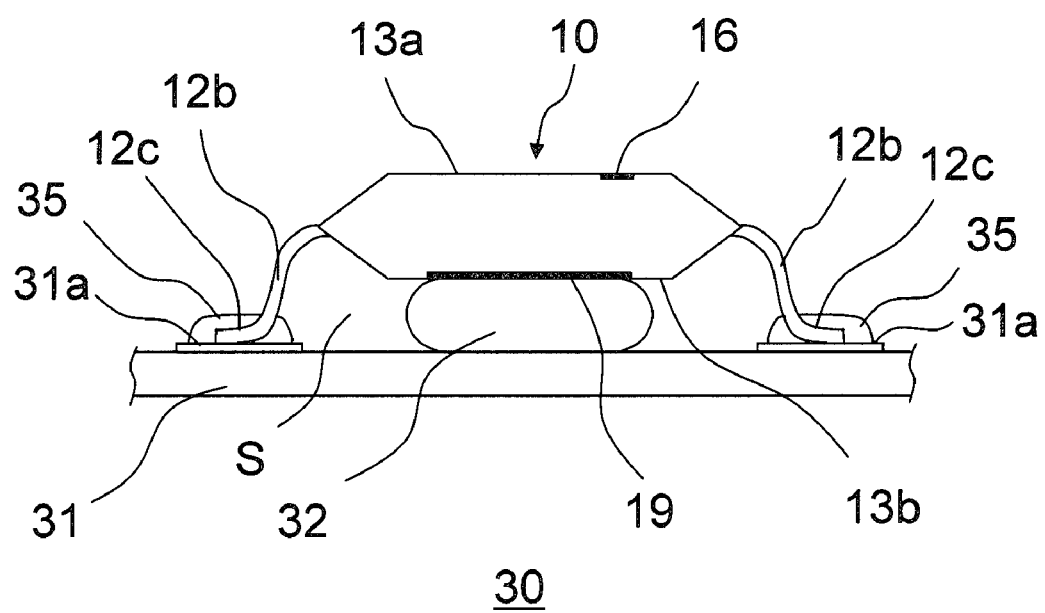
FIG. 13 is a schematic view showing an electronic device of one embodiment of the present invention.

FIG. 13 is a schematic view of the electronic device 30 of one embodiment of the present invention. As shown in FIG. 13, the electronic device 30 includes the mounting board 31, adhesive 32, and the above-mentioned semiconductor package 10. The space S is formed between the sealing resin 13 and mounting board 31 of the semiconductor package 10.

The mounting board 31 is, for example, a glass epoxy board. The mounting board 31 includes plural wiring layers and plural vias that connect the wiring layers. Plural electrode pads 31a are formed on the surface of the mounting board 31. Such as Al may be used as a material of the electrode pad 31a. However, the material of an electrode pad 31a is not especially limited thereto. The adhesive 32 is used to tentatively fix the semiconductor package 10 on the mounting board 31. The adhesive 32 is disposed in the space S, and covers the whole of the concave pattern 19. That is, the concave pattern 19 is formed inside the edge of the adhesive 32 (Refer to the alternate long and two short dashes line in FIGS. 2 to 4). The adhesive 32 adheres to the surface of the mounting board 31, and is embedded in the concave pattern 19 formed in the sealing resin 13 of the semiconductor package 10 (Refer to the alternate long and two short dashes line of FIG. 5). A thermosetting resin such as epoxy resin may be used as a material of the adhesive 32. However the material of the adhesive 32 is not especially limited thereto. The end portion 12c of each outer lead part 12b is electrically connected on each electrode pad 31a of the mounting board 31 with solder 35.

Manufacturing Process of the Electronic Device 30

Figure 14:
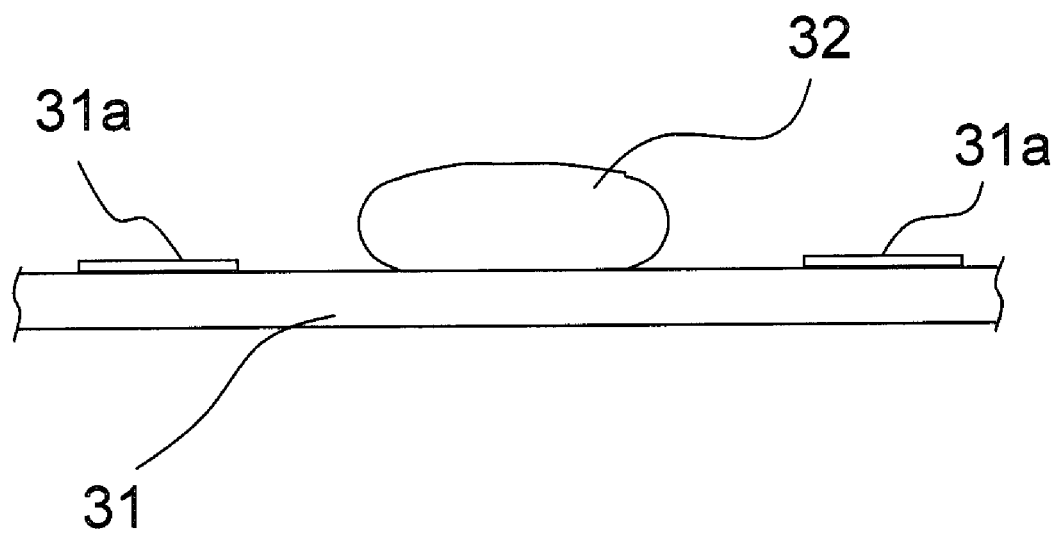
FIG. 14 is a schematic view of an electronic device of one embodiment of the present invention.
Figure 15:
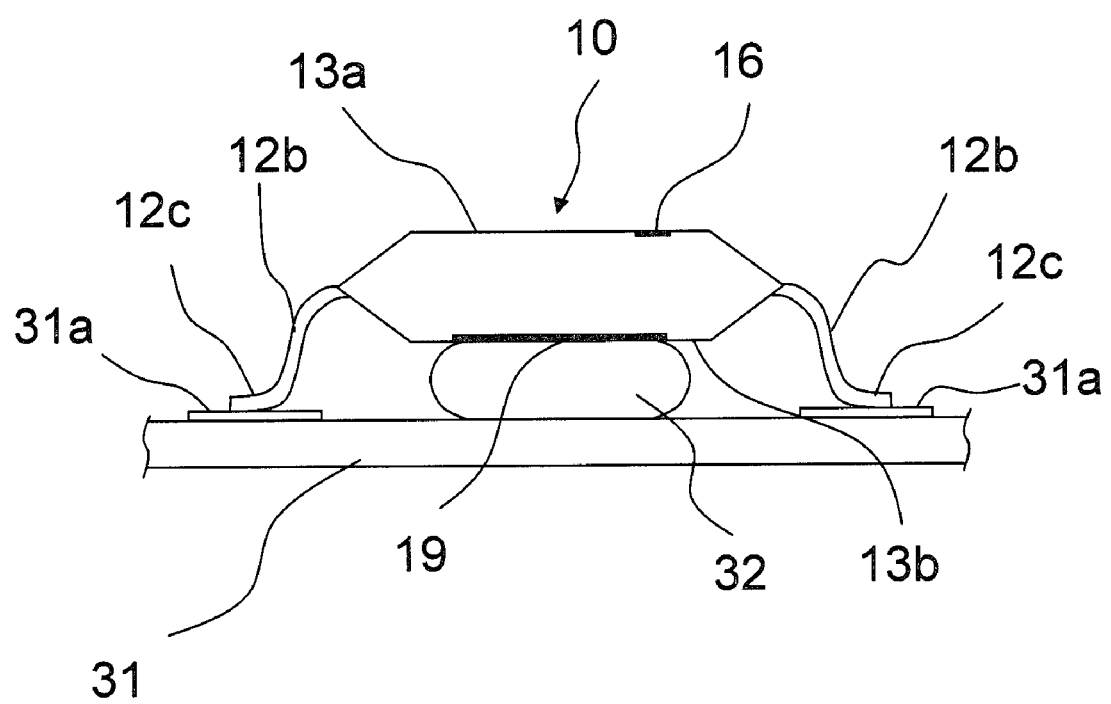
FIG. 15 is a schematic view of an electronic device of one embodiment of the present invention.
Figure 16:
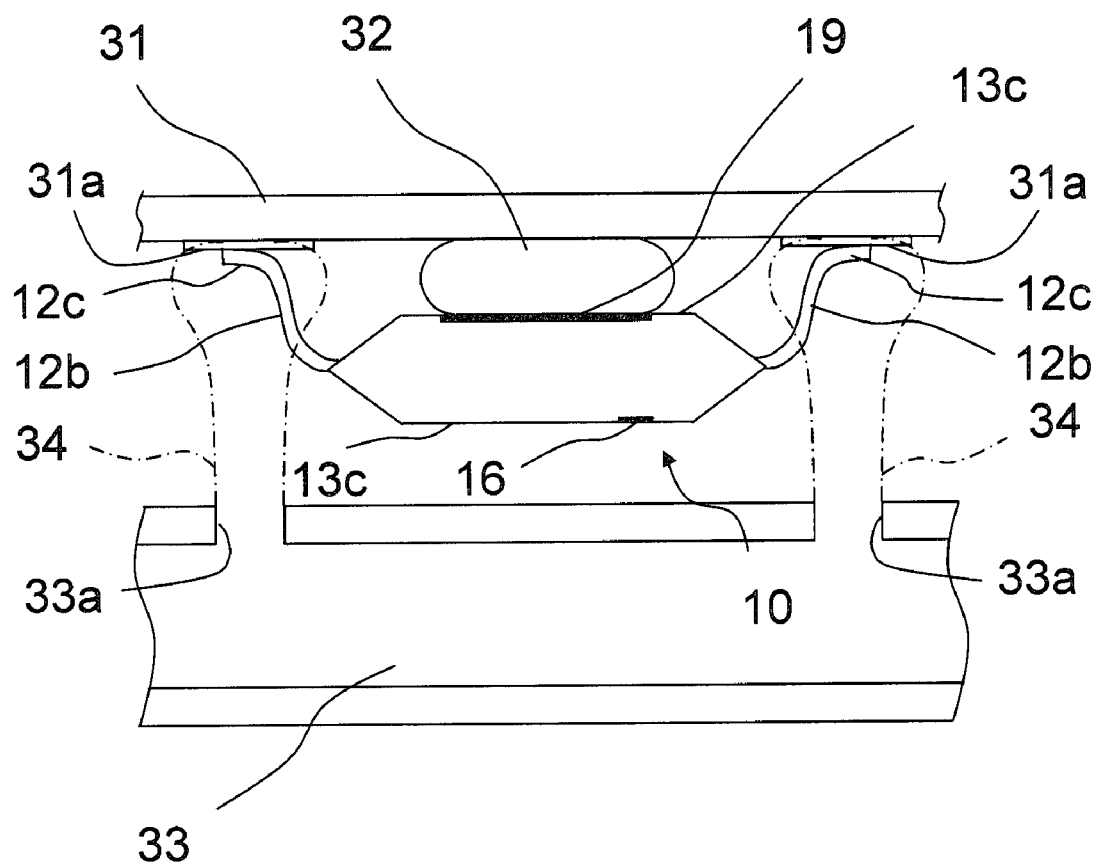
FIG. 16 is a schematic view of an electronic device of one embodiment of the present invention.

Referring to FIGS. 14 to 17, the manufacturing process of the electronic device 30 is explained. FIGS. 14 to 16 are the process charts of the manufacturing process of the electronic device 30 of one embodiment of the present invention. As shown in FIG. 14, the uncured adhesive 32 is dispensed on the main surface of the mounting board 31. As for the amount of dispensing, it is assumed to be, for example, about 1 to 10 mg. Next, as shown in FIG. 15, the end portion 12c of the outer lead part 12b is mounted to the electrode pad 31a of the mounting board 31 in posture in which the second main surface 13b of the sealing resin 13 is turned to the mounting board 31. As a result, the adhesive 32 of the uncured adhesive 32 dispensed on the mounting board 31 is embedded in the concave pattern 19 formed on the second main surface 13b of the sealing resin 13 by the pressure from the sealing resin 13. Next, the adhesive 32 is cured by heating the mounting board 31 and semiconductor package 10, for example, in the temperature of about 100 to 150° C. for about 30 to 300 seconds. As a result, the semiconductor package 10 is tentatively fixed to the mounting board 31.

Next, as shown in FIG. 16, for example, by such as the reversing unit, the mounting board 31 is turned upside down to make the semiconductor package 10 be under the mounting board 31. The semiconductor package 10 occasionally dropped out of the mounting board 31 when the mounting board 31 is turned upside down according to the mounting technology disclosed in the above-mentioned Japanese Laid-open Patent Application No. Hei 11-54687. However, because the adhesive 32 in the present embodiment is embedded in the concave pattern 19 formed in the sealing resin 13 of the semiconductor package 10 as shown in alternate long and two short dashes line in FIG. 5, the dropout of the semiconductor package 10 from the adhesive 32 can be prevented by the anchor effect. In addition, the dropout of the semiconductor package 10 from the adhesive 32 can be prevented due to the above-mentioned anchor effect, even if the second main surface 13b of the sealing resin 13 is wet by the wax which exudes from the inside of the sealing resin 13. Usually, the more inside it goes from the surface of the sealing resin 13, the more the concentration of the wax added to the sealing resin 13 decreases. As a result, the internal area of low wax concentration in the sealing resin can be exposed by forming the concave pattern 19 in the second main surface 13b of the sealing resin 13 as shown in the present embodiment. This can also increase the bonding between the sealing resin 13 of the semiconductor package 10 and adhesive 32. Subsequently, the end portion 12c of the outer lead part 12b is connected with the electrode pad 31a of the mounting board 31 by flow soldering. Specifically, for example, the mounting board 31 on which the semiconductor package 10 is tentatively fixed is transported by the conveying unit, and the electrode pad 31a and outer lead part 12b are wet with the melt solder 34 jetting from the aperture 33a of the solder flow bath 33. As a result, the melt solder 34 is supplied to each electrode pad 31a and the outer lead part 12b. In addition, though the melt solder 34 will be in contact with not only the outer lead part 12b but other portions such as the sealing resin 13, it selectively remains only on the plated end portion 12c of the outer lead part 12b. The melt solder 34 supplied to each electrode pad 31a and the end portion 12c of the outer lead part 12b is naturally or forcibly cooled down and the supplied melt solder is made into solid solder 35. As a result, as shown in FIG. 13, the outer lead part 12b of the semiconductor package 10 is connected with the electrode pad 31a of the mounting board 31 electrically and mechanically.

Second Embodiment

Figure 17:
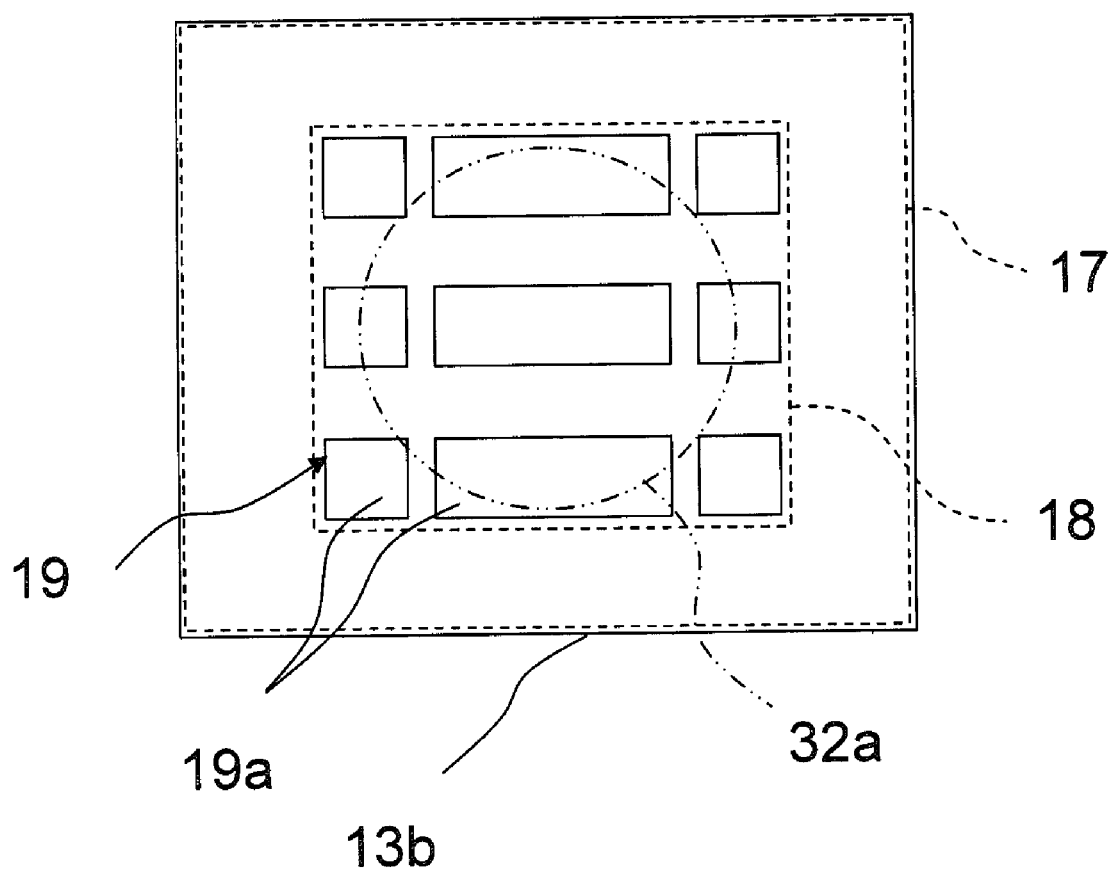
FIG. 17 is a plan view showing a concave pattern of another embodiment of the present invention.

A second embodiment of the present invention is described in reference to FIG. 17. FIG. 17 is a plan view of the concave pattern 19 of the second embodiment of the present invention. In the above-mentioned embodiment, the concave pattern 19 is formed inside the edge of adhesive 32 as shown in FIGS. 2 to 4. As a result, the peripheral portion of the adhesive 32 cannot be embedded in the concave pattern 19. However, as shown in FIG. 17, the concave pattern 19 is formed up to the outside of the edge of the adhesive 32a in the present embodiment. As a result, it is possible to increase the portion of the adhesive 32a embedded in the concave pattern 19, and to generate a stronger anchor effect between the concave pattern 19 and the adhesive 32a.

These embodiments were explained by such as QFP (quad flat package) and SOP (small outline package) as examples, though, for example, SOJ (small outline j-leaded package) can also be given as an example.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor package comprising:
    a substrate;
    a semiconductor device mounted on the substrate;
    a resin member sealing the substrate and semiconductor device, the resin member including a first surface and a second surface located on a side opposite to the first surface; and
    a plurality of leads electrically connected with the semiconductor device, the leads projecting from the resin member and extending to the second surface side;
    wherein the second surface of the resin member includes a first area having a first concave portion and a second area having a second concave portion, the second area is different from the first area, and the second concave portion is deeper than the first concave portion.

2. The semiconductor package according to claim 1, wherein
    a third concave portion is formed on a surface that is different from the second surface of the resin material.

3. The semiconductor package according to claim 1, wherein
    the resin member includes wax.

4. The semiconductor package according to claim 1, wherein
the leads are L-type leads.

5. An electronic device, comprising:
a mounting board;
a semiconductor package including resin member and a plurality of leads projecting from the resin member and electrically connected with the mounting board; and
an adhesive bonding the semiconductor package with the mounting board;
wherein a surface of the resin member opposite to the mounting board includes a first area having a first concave portion and;
a second area having a second concave portion and being different from the first area, and the second concave portion is deeper than the first concave portion and is embedded with the adhesive.

6. The electronic device according to claim 5, wherein
a third concave portion is formed on a surface that is different from the surface opposed to the mounting board.

7. The electronic device according to claim 5, wherein
the second concave portion is formed at least up to an edge of the adhesive.

8. The electronic device according to claim 5, wherein
the adhesive includes a thermosetting resin.

9. The electronic device according to claim 5, wherein
the resin material includes wax.

10. The electronic device of claim 5, wherein
the leads are L-type leads.

* * * * *